(12) United States Patent
Kim

(10) Patent No.: US 9,291,673 B2
(45) Date of Patent: Mar. 22, 2016

(54) SEMICONDUCTOR APPARATUS

(71) Applicant: SK hynix Inc., Icheon-si Gyeonggi-do (KR)

(72) Inventor: Ki Up Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 468 days.

(21) Appl. No.: 13/845,411

(22) Filed: Mar. 18, 2013

(65) Prior Publication Data

US 2014/0159765 A1    Jun. 12, 2014

(30) Foreign Application Priority Data

Dec. 11, 2012   (KR) .................. 10-2012-0143597

(51) Int. Cl.
*G01R 27/28*    (2006.01)
*G01R 31/317*   (2006.01)

(52) U.S. Cl.
CPC ................. *G01R 31/31725* (2013.01)

(58) Field of Classification Search
CPC ............ G01R 31/31937; G01R 31/31917; G01R 31/311; G01R 31/31727; G01R 31/318541; G01R 31/31932; G01R 31/2889; G01R 31/2843; G01R 31/31725; G01R 31/31922; G01R 31/31813; G01R 31/3183; G01R 31/318552; G01R 31/318555; G01R 31/1919; G01R 31/26
USPC .................. 324/762.01–762.1, 754.01–754.3
See application file for complete search history.

(56) References Cited

U.S. PATENT DOCUMENTS

| | | | |
|---|---|---|---|
| 5,327,076 A * | 7/1994 | Bailey ...................... | 324/750.05 |
| 8,169,842 B2 * | 5/2012 | Lee ......................... | G11C 29/02 365/189.07 |
| 8,351,282 B2 | 1/2013 | Lee | |
| 2002/0141280 A1 * | 10/2002 | Hamamoto et al. .......... | 365/233 |
| 2006/0190785 A1 * | 8/2006 | Pilling ........................ | 714/726 |
| 2009/0121738 A1 * | 5/2009 | Narikawa ..................... | 324/765 |
| 2010/0039875 A1 * | 2/2010 | Stott et al. .................... | 365/193 |
| 2012/0269014 A1 * | 10/2012 | Kim ..................... | G11C 7/1072 365/193 |

* cited by examiner

*Primary Examiner* — Arleen M Vazquez
*Assistant Examiner* — Robert P Alejnikov, Jr.
(74) *Attorney, Agent, or Firm* — William Park & Associates Ltd.

(57) ABSTRACT

A semiconductor apparatus includes: an output timing test unit configured to edge-trigger a pad output data applied from an input/output pad at a first timing and output the edge-triggered pad output data as output timing test data, during an output timing test mode, and a test output unit configured to receive the output timing test data and output the received output timing test data to a probe pad.

18 Claims, 7 Drawing Sheets

SEMICONDUCTOR APPARATUS

CROSS-REFERENCES TO RELATED APPLICATION

The present application claims priority under 35 U.S.C. §119(a) to Korean application number 10-2012-0143597 filed Dec. 11, 2012 in the Korean Intellectual Property Office, which is incorporated herein by reference in its entirety.

BACKGROUND

1. Technical Field

Various embodiments relate generally to a semiconductor apparatus, and more particularly, to a semiconductor apparatus with a test circuit.

2. Related Art

When a semiconductor apparatus is fabricated, a test process is performed to determine whether the semiconductor apparatus normally operates. This is done by checking whether or not normal data is outputted after an electrical signal has been applied to a pad of the semiconductor apparatus.

Recently, a semiconductor apparatus in which semiconductor chips are stacked and coupled with through silicon vias (TSVs) has been developed. Such a semiconductor apparatus may employ a bump pad structure for an input/output pad. That is, the plurality of chips is coupled through TSVs inside a semiconductor package, and the bump pad serves to transmit signals between the TSVs of the respective chips. Since the bump pad handles a small data output load, an output driver to output data to the bump pad has restrained drivability compared to a general semiconductor apparatus.

Thus, the semiconductor apparatus cannot handle the load of a probe test device using only the bump pad structure. Accordingly, the semiconductor apparatus includes a separate circuit and pad for the probe test.

FIG. 1 is a block diagram of a semiconductor apparatus with a general bump pad structure.

The semiconductor apparatus of FIG. 1 includes a data output unit 1, an input/output pad 2, a test output unit 4, and a probe pad 5.

During a read operation, data stored in a memory cell (not illustrated) is transmitted through a data line GIO. The data output unit 1 is configured to receive the transmitted data DATA and transmit output data DO to the input/output pad 2. The input/output pad 2 may have a small data output load and may be formed as a bump pad.

The probe pad 5 is separately provided to perform a probe test for the semiconductor apparatus. The test output unit 4 receives the transmitted data DATA and outputs test output data TDO, when a test mode signal TM (not shown) is activated. The data drivability of the test output unit 4 is set to be larger than that of the data output unit 1. The test output data TDO may be outputted through the probe pad 5.

The probe test for the semiconductor apparatus may be performed using the test output unit 4 and the probe pad 5. Through the probe test, data stored in the semiconductor apparatus may be outputted and probed to verify whether memory cells have a defect or not.

However, latent defects of the semiconductor apparatus not only may exist in memory cells, but also may exist in various parts of the semiconductor apparatus. For example, the latent defects may exist in a data output path for outputting data externally, such as to an output driver and related circuits.

Therefore, there is a demand for a method to screen the latent defects during the probe test to increase the operation and reliability of the semiconductor apparatus.

SUMMARY

In an embodiment, a semiconductor apparatus includes: an output timing test unit configured to edge-trigger a pad output data applied from an input/output pad at a first timing and output the edge-triggered pad output data as output timing test data, during an output timing test mode; and a test output unit configured to receive the output timing test data and output the received output timing test data to a probe pad.

In an embodiment, a semiconductor apparatus includes: an output timing test unit configured to edge-trigger a pad output data applied from an input/output pad in synchronization with a delayed reference clock signal and output the edge-triggered pad output data as output timing test data, when an activated output timing test signal is applied; and a test output unit configured to be enabled during a test mode, and output any one of a transmit test data or the output timing test data as test output data to a probe pad, in response to a timing test check signal.

BRIEF DESCRIPTION OF THE DRAWINGS

Features, aspects, and embodiments are described in conjunction with the attached drawings, in which.

DETAILED DESCRIPTION

Hereinafter, a semiconductor apparatus according to the present invention will be described below with reference to the accompanying drawings through exemplary embodiments.

Figure 1:
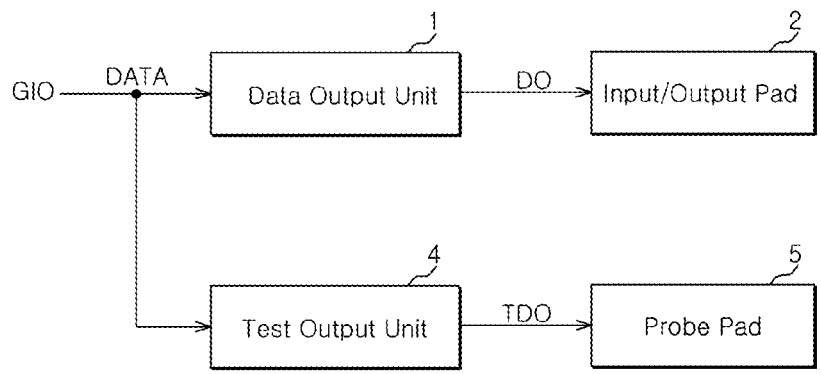
FIG. 1 is a block diagram illustrating an output path of a conventional semiconductor apparatus.
Figure 2:
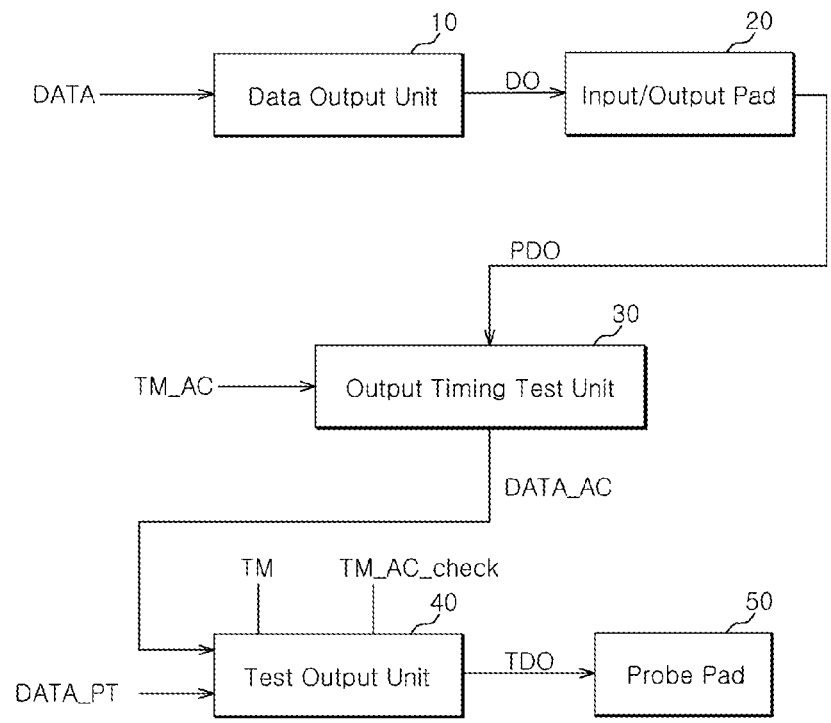
FIG. 2 is a block diagram of a semiconductor apparatus according to an embodiment of the present invention.

Referring to FIG. 2, a data output unit 10 may be configured to receive data DATA transmitted from a data line (not illustrated) and generate output data DO to be outputted externally. The data output unit 10 may include a flip-flop to output data in synchronization with a clock signal and a driver to drive data.

An input/output pad 20 may be configured to output the output data DO externally. In an embodiment, a pad with a small output load as the input/output pad 20 will be taken as an example for description. A bump pad may be used. Since the input/output pad 20 has a small output load, the data output unit 10 may be set to have low drivability.

An output timing test unit 30 may be configured to verify a data output timing of the semiconductor apparatus using the output data DO outputted to the input/output pad 20 during an output timing test mode. When an activated output timing test signal TM_AC is applied, the output timing test unit 30 edge-triggers pad output data PDO at a first timing and outputs the edge-triggered pad output data as output timing test data DATA_AC.

In general, a semiconductor apparatus outputs data through an input/output pad at a predetermined time after a read command has been applied. The number of clocks required until data is outputted externally through the input/output pad after the read command has been applied is referred to as CAS latency (CL). The CL is defined as a specific value, and when a normal semiconductor apparatus outputs data, CL requirements need to be satisfied.

In order for the read data to be outputted while satisfying the CL, the read data must be outputted externally at a preset timing, with a predetermined period after the read command has been applied, in order to perform a normal operation. As a specific index indicating the predetermined period, a maximum time during which data must be outputted externally from a time of CL-1tck is referred to as tAC (Access Time from CLK). For example, when CL is 3, the read data must be outputted externally within the tAC from a rising edge of a second clock signal, in order to guarantee a normal operation of the semiconductor apparatus. The tAC is defined as is CL.

The output timing test unit 30 may verify the output timing of the output data DO while the first timing is set to various times. A designer may vary an edge triggering time of the pad output data PDO to precisely when data is changed to the read value. The time may correspond to a data output timing of the corresponding input/output pad 20.

In an embodiment, the output timing test unit 30 may verify whether or not the pad output data PDO is outputted within a desired output period, while the first timing is set to various times within the tAC.

The test output unit 40 may be enabled during a probe test mode. When an activated test mode signal TM is applied, the test output unit 40 may output any one of transmit test data DATA_PT or output timing test data DATA_AC as the test output data TDO to a probe pad 50, in response to a timing test check signal TM_AC_check.

When a deactivated timing test check signal TM_AC_check is applied during the probe test mode, data stored in the semiconductor apparatus such as the transmit test data DATA_PT transmitted through a global line (not illustrated) may be outputted as the test output data TDO. On the other hand, when an activated timing test check signal TM_AC_check is applied during the output timing test mode, the output timing test data DATA_AC may be outputted as the test output data TDO.

The probe pad 50 may be a pad to output the test output data TDO externally. Since the probe pad 50 is separately provided for a probe test, the output load of the probe pad 50 may be set to be larger than that of the input/output pad 20. Since the probe pad 50 has a relatively large output load, the drivability of the test output unit 40 is set to be larger than that of the data output unit 10.

Figure 3:
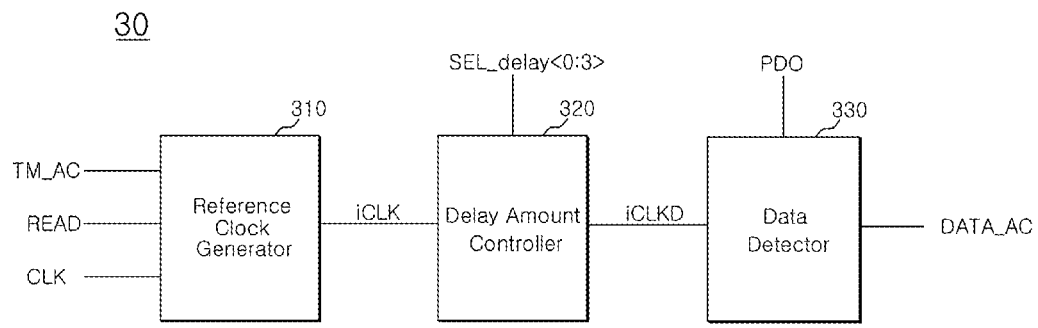
FIG. 3 is a block diagram illustrating the output timing test unit of FIG. 2.

Referring to FIG. 3, the output timing test unit 30 may include a reference clock generator 310, a delay amount controller 320, and a data detector 330.

The reference clock generator 310 may be configured to generate a reference clock signal iCLK having an activated pulse width when a predetermined time passes after the activated output timing test signal TM_AC and a read command READ are applied. The reference clock signal iCLK may be generated to have the same pulse width as an external clock signal CLK. Preferably, the reference clock generator 310 may generate the reference clock signal iCLK to have an activated pulse width within a preset CL after the read command READ has been applied.

The delay amount controller 320 may be configured to control the delay amount of the reference clock signal iCLK in response to a delay amount select signal SEL_delay<0:3>, and output the delayed reference clock signal iCLKD. The delay amount select signal SEL_delay<0:3> may be varied whenever a test is performed. Accordingly, the delay amount controller 320 may generate the delayed reference clock signal iCLKD activated at various times. The delay amount controller 320 may control the activation timing of the delayed reference clock signal iCLKD before and after when read data is to be outputted externally for a normal operation after the read command READ has been applied. In an embodiment, the delay amount controller 320 may control the delay amount of the reference clock signal iCLK such that the delayed reference clock signal iCLKD is activated at a specific time within the preset tAC after the read command READ has been applied.

The data detector 330 may be configured to edge-trigger the pad output data PDO in synchronization with the delayed reference clock signal iCLKD and output the edge-triggered data as the output timing test data DATA_AC. The data outputted to the input/output pad 20 may be outputted at a specific time at which the data is to be verified. When the data read at the specific time is accurately outputted, the output timing test data DATA_AC may also have the read data value.

Figure 4:
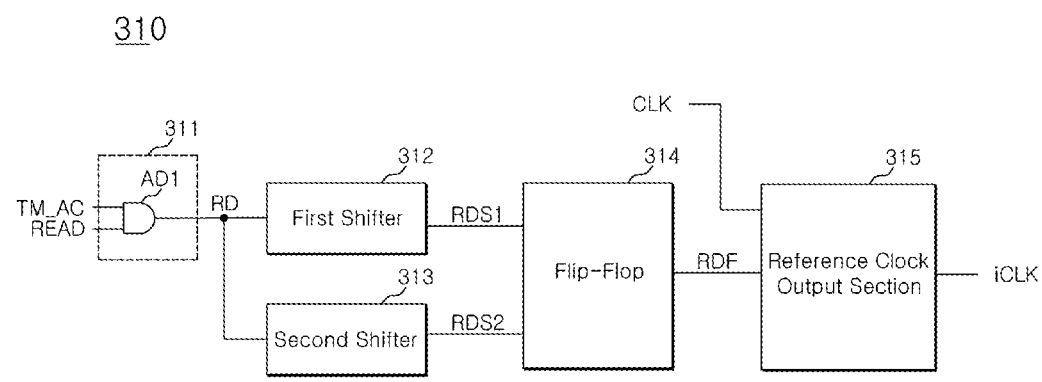
FIG. 4 is a block diagram illustrating the reference clock generator of FIG. 3.

Referring to FIG. 4, the reference clock generator 310 may include a reference signal generation section 311, first and second shifters 312 and 313, a flip-flop 314, and a reference clock output section 315.

The reference signal generation section 311 may be configured to perform an AND operation on the output timing test signal TM_AC and the read command READ and output a reference signal RD. Specifically, the reference signal generation section 311 may include a first AND gate AD1 configured to receive the output timing test signal TM_AC and the read command READ. The reference signal generation section 311 may generate the reference signal RD which is activated when the read command READ is applied during an output timing test mode.

The first and second shifters 312 and 313 may be configured to delay the reference signal RD by first and second times and output the delayed signals as first and second delayed reference signals RDS1 and RDS2. For example, when the preset CL is 3, the first and second shifters 312 and 313 may delay the reference signal RD by 1.5tCK and 2.5tCK after the read command READ has been applied.

The flip-flop 314 may be configured to generate a reference period signal RDF which is activated during when the first delayed reference signal RDS1 is applied to when the second delayed reference signal RDS2 is applied.

The reference clock output section 315 may be configured to perform an AND operation on an external clock signal CLK and the reference period signal RDF and generate the reference clock signal iCLK. The reference clock signal iCLK may be generated to have the same pulse width as the external clock signal CLK when the reference period signal RDF is activated.

Figure 5:
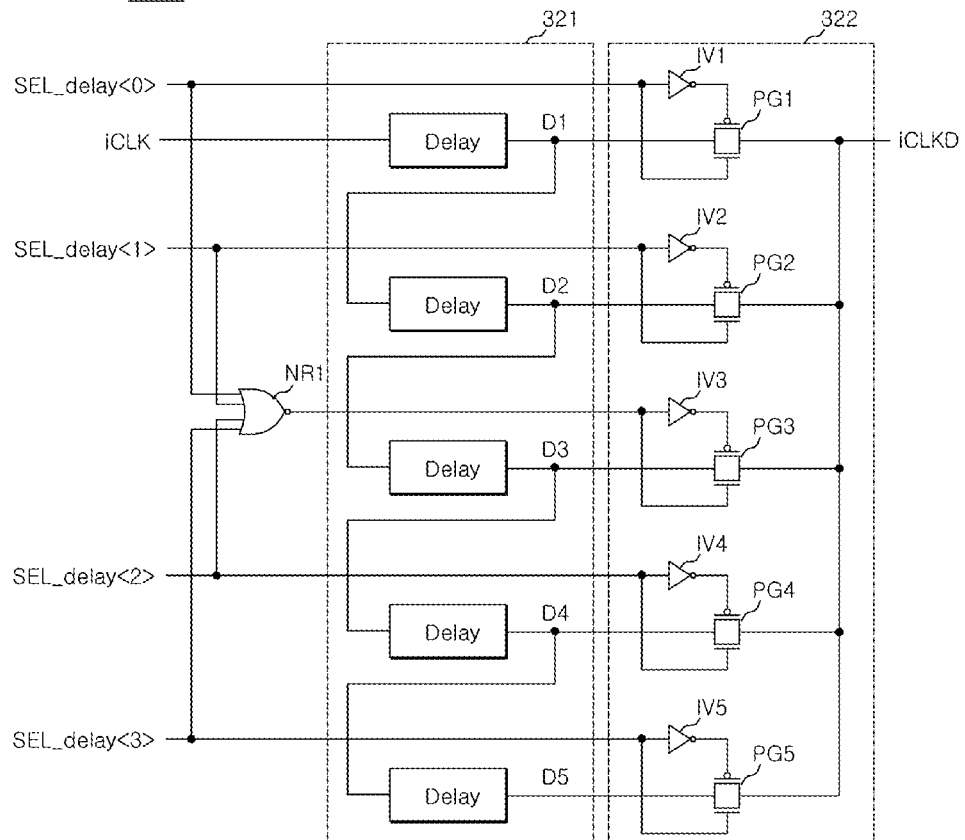
FIG. 5 is a circuit diagram illustrating the delay amount controller of FIG. 3.

Referring to FIG. 5, the delay amount controller 320 may include a delay section 321 and a select section 322.

The delay section 321 may include a plurality of delays coupled in series to delay the reference clock signal iCLK.

The select section 322 may be configured to output any one of output signals D1 to D5 of the plurality of delays as the delayed reference clock signal iCLKD in response to the delay amount select signal SEL_delay<0:3>. Specifically, the select section 322 may include first to fifth inverters IV1 to IV5 configured to invert the delay amount select signal SEL_delay<0:3> and first to fifth pass gates PG1 to PG5 configured to output the output signals D1 to D5 of the respective delays in response to the delay amount select signal SEL_delay<0:3> and output signals of the first to fifth inverters IV1 to IV5.

In an embodiment, a result obtained by combining the delay amount select signal SEL_delay<0:3> may be used to select the output signals D1 to D5 of the respective delays. According to the configuration of FIG. 5, when the delay amount select signal SEL_delay<0> is at a high level, the first output signal D1 is outputted as the delayed reference clock signal iCLKD. When the delay amount select signal SEL_delay<1> is at a high level, the second output signal D2 is outputted as the delayed reference clock signal iCLKD. When the delay amount select signal SEL_delay<2> is at a high level, the fourth output signal D4 is outputted as the delayed reference clock signal iCLKD. When the delay amount select signal SEL_delay<3> is at a high level, the fifth output signal D5 is outputted as the delayed reference clock signal iCLKD. When all bits of the delay amount select signals SEL_delay<0:3> are at a low level, the third output signal D3 is outputted as the delayed reference clock signal iCLKD through a first NOR gate NR1.

Figure 6:
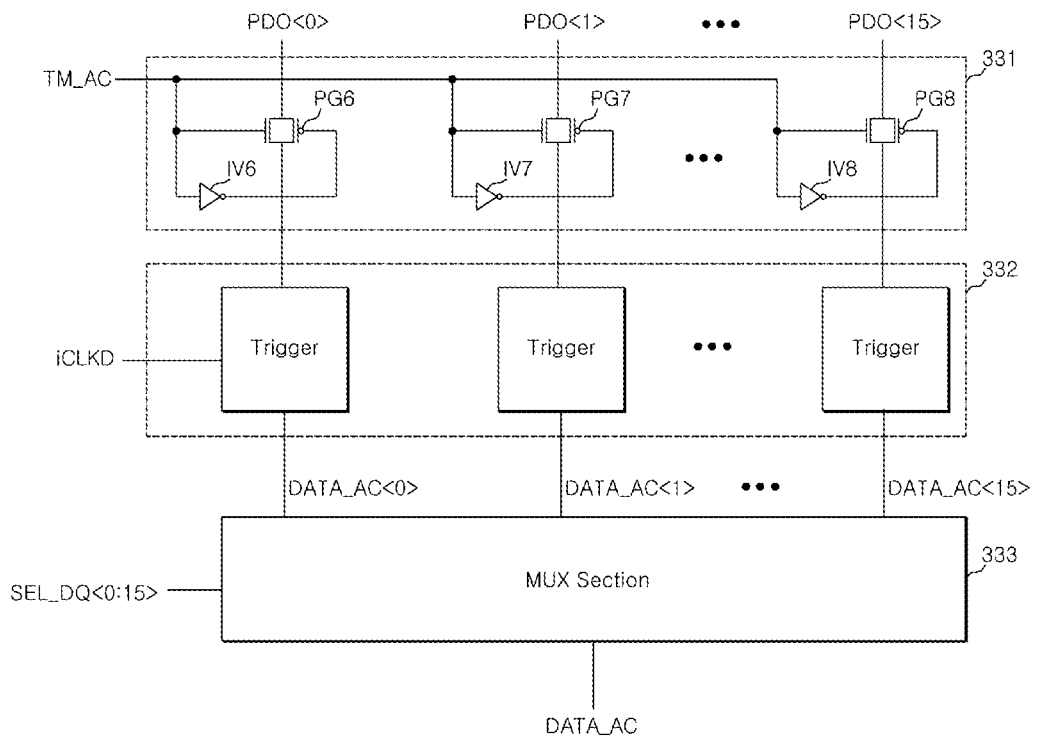
FIG. 6 is a circuit diagram illustrating the data detector of FIG. 3.

Referring to FIG. 6, the data detector 330 may include a trigger section 332.

The trigger section 332 may include a plurality of triggers configured to receive a plurality of pad output data PDO<0:15> and edge-trigger the received pad output data PDO<0:15> in synchronization with the delayed reference clock signal iCLKD. The output timing test data DATA_AC<0:15> obtained by edge-triggering the plurality of pad output data PDO<0:15> may be latched until the next test is performed.

Figure 7:
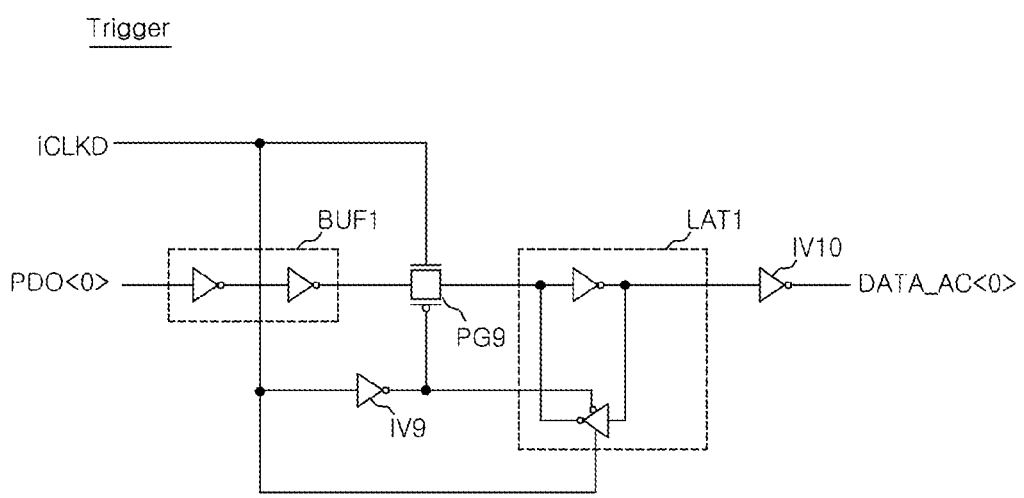
FIG. 7 is a circuit diagram illustrating the trigger of FIG. 6.

Referring to FIG. 7, the trigger may include a buffer BUF1, a pass gate PG9, and a latch LAT1. The buffer BUF1 may be configured to buffer the first pad output data PDO<0>. The pass gate PG9 may be configured to transmit the buffered first pad output data PDO<0> to the next stage in response to the delayed reference clock signal iCLKD and the delayed reference clock signal iCLKD inverted by an inverter IV9. The latch LAT1 may be configured to latch an output of the pass gate PG9 in response to the delayed reference clock signal iCLKD and the delayed reference clock signal iCLKD inverted by the inverter IV9. The latch data may be outputted as the first output timing test data DATA_AC<0> through the inverter IV10.

The plurality of triggers may trigger and output the respective pad output data PDO<0:15> when the delayed reference clock signal iCLKD is activated.

The data detector 330 may further include an input section 331 configured to apply the plurality of pad output data PDO<0:15> to the trigger section 332 in response to an output timing test signal TM_AC.

The input section 331 may include a plurality of inverters IV6 to IV8 and a plurality of pass gates PG6 to PG8. The plurality of inverters IV6 to IV8 may be configured to invert the output timing test signal TM_AC so as to control the transmission of the pad output data PDO<0:15>.

Furthermore, the data detector 330 may further include a multiplexer (MUX) section 333 configured to output any one of the edge-triggered pad output data DATA_AC<0:15> as the output timing test data DATA_AC.

The MUX section 333 may output any one of the edge-triggered pad output data DATA_AC<0:15> as the output timing test data DATA_AC in response to the select signal SEL_DQ<0:15>. In an embodiment, the MUX section 333 may receive a select signal SEL_DQ<0:15> which is sequentially varied, and sequentially output the edge-triggered pad output data DATA_AC<0:15>.

Figure 8:
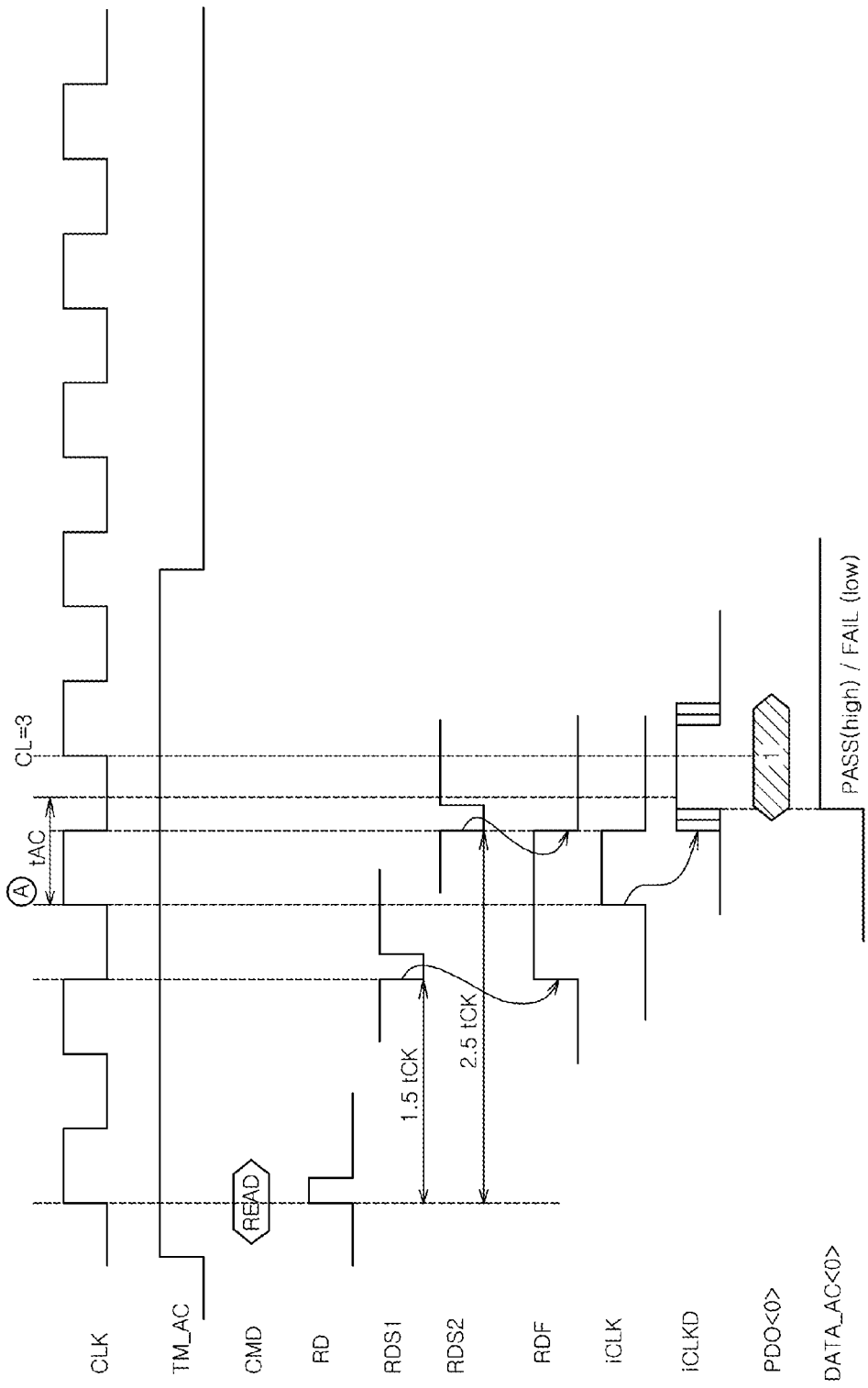
FIG. 8 is an operation waveform diagram of the semiconductor apparatus according to an embodiment of the present invention.

Referring to FIG. 8, the output timing test signal TM_AC may be activated, and the read command READ may be applied to a command CMD to the semiconductor apparatus in synchronization with the external clock CLK. The reference signal RD may be activated when the read command READ is applied. Then, the reference signal RD may be delayed by the first and second times and outputted as the first and second delayed reference signals RDS1 and RDS2, respectively. In this embodiment, the CL may be set to 3, and the first and second times may be set to 1.5tCK and 2.5tCL, respectively.

The reference period signal RDF may be generated in response to the first and second delayed reference signals RDS1 and RDS2, and an AND operation on the reference period signal RDF and the external clock signal CLK may be performed to generate the reference clock signal iCLK.

Subsequently, the activation timing of the delayed reference clock signal iCLKD may be adjusted by delaying the reference clock iCLK to a predetermined time before and after a preset time when read data is to be outputted for a normal operation. As illustrated in FIG. 8, the delay amount of the reference clock signal iCLK may be adjusted to activate the delayed reference clock signal iCLKD at a specific time within the preset tAC after the read command READ has been applied.

The first pad output data PDO<0> may be edge-triggered in synchronization with the delayed clock signal iCLKD and outputted as first output timing test data DATA_AC<0>. For example, when data to be read is 1, the level of the first output timing test data DATA_AC<0> may be detected through the probe pad at the activation time of the delayed clock signal iCLKD. The delay amount of the delayed reference clock signal iCLKD may be controlled in various manners so as to detect the data output timing of the semiconductor apparatus.

Figure 9:
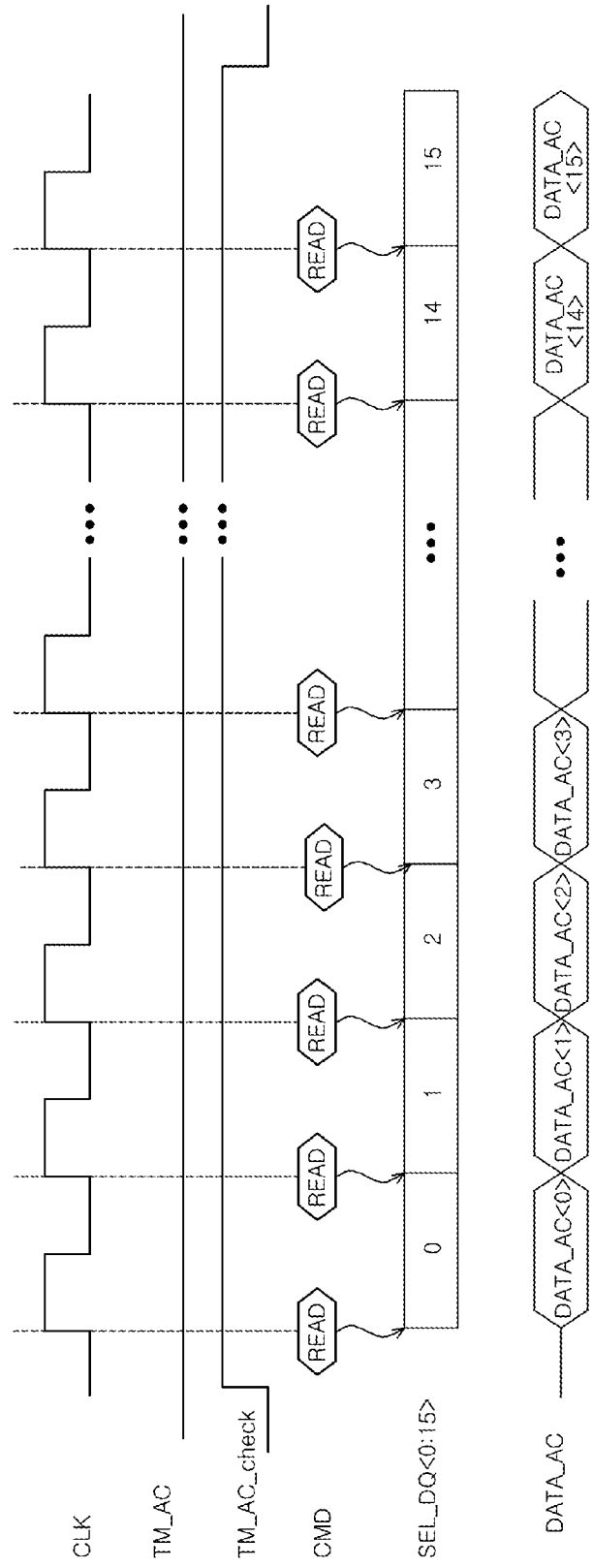
FIG. 9 is another operation waveform diagram of the semiconductor apparatus according to an embodiment of the present invention.

Referring to FIG. 9, when the output timing test signal TM_AC is activated to edge-trigger all of the plurality of pad output data PDO<0:15>, the output timing test signal TM_AC may be deactivated, and the timing test check signal TM_AC_check may be activated.

Whenever the read command READ is applied, the edge-triggered pad output data DATA_AC<0:15> may be sequentially outputted. When the select signal SEL_DQ<0:15> corresponding to an address is increased sequently whenever the read command READ is applied, the edge-triggered pad output data DATA_AC<0:15> may be sequentially outputted as the test output data TDO. As the test output data TDO is detected through one probe pad, the data output timing test for the plurality of input/output pads may be performed.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
   an output timing test unit configured to receive an output data applied from an input/output pad at a first time according to an edge triggering method and output the output data as output timing test data, during an output timing test mode; and a test output unit configured to receive the output timing test data and output the output timing test data to a probe pad, wherein the output timing test unit comprises:

a reference clock generator configured to generate a reference clock signal having an activated pulse width at the first time;

a delay amount controller configured to control a delay amount of the reference clock signal in response to a delay amount select signal and generate the delayed reference clock signal; and a data detector configured to output the output data in synchronization with the delayed reference clock signal and output the output data as the output timing test data.

2. The semiconductor apparatus according to claim 1, wherein the first time comprises a predetermined time lapsed after a read command has been applied.

3. The semiconductor apparatus according to claim 1, wherein the first time is set to a time within a preset tAC (Access Time from CLK) after a read command has been applied.

4. The semiconductor apparatus according to claim 1, wherein the output timing test unit receives a plurality of output data and outputs the received plurality of output data at the first time according to the edge triggering method.

5. The semiconductor apparatus according to claim 4, wherein the output timing test unit comprises a multiplexer (MUX) section configured to output any one of the plurality of edge-triggered pad output data as the output timing test data in response to a selection signal.

6. The semiconductor apparatus according to claim 5, wherein the MUX section receives the selection signal sequentially, and sequentially outputs the plurality of output data.

7. The semiconductor apparatus according to claim 1, wherein the test output unit outputs transmit test data as test output data to the probe pad during a probe test mode, and outputs the output timing test data as the test output data to the probe pad during the output timing test mode.

8. A semiconductor apparatus comprising:

an output timing test unit configured to output an output data applied from an input/output pad in synchronization with a delayed reference clock signal according to an edge triggering method and output the edge-triggered output data as output timing test data, when an activated output timing test signal is applied; and a test output unit configured to be enabled during a test mode, and output any one of a transmit test data or the output timing test data as test output data to a probe pad, in response to a timing test check signal, wherein the output timing test unit comprises:

a reference clock generator configured to generate a reference clock signal having an activated pulse width when a predetermined time lapses after the activated output timing test signal and a read command are applied;

a delay amount controller configured to control a delay amount of the reference clock signal in response to a delay amount select signal and generate the delayed reference clock signal; and a data detector configured to output the output data in synchronization with the delayed reference clock signal and output the output data as the output timing test data.

9. The semiconductor apparatus according to claim 8, wherein the reference clock generator generates the reference clock signal having an activated pulse width within preset CAS latency after the read command is applied.

10. The semiconductor apparatus according to claim 8, wherein the reference clock generator comprises:

a reference signal generation section configured to perform an operation on the output timing test signal and the read command and output a reference signal;

a first shifter configured to delay the reference signal by a first time and output the delayed signal as a first delayed reference signal;

a second shifter configured to delay the reference signal by a second time and output the delayed signal as a second delayed reference signal;

a flip-flop configured to generate a reference period signal which is activated during when the first delayed reference signal is applied to when the second delayed reference signal is applied; and a reference clock output section configured to perform an operation on an external clock signal and the reference period signal and generate the reference clock signal.

11. The semiconductor apparatus according to claim 8, wherein the delay amount controller outputs the delayed reference clock signal at a time within a preset tAC after the read command is applied.

12. The semiconductor apparatus according to claim 8, wherein the delay amount controller comprises:

a delay section comprising a plurality of delays coupled in series to delay the reference clock signal; and a select section configured to output any one of output signals of the delays as the delayed reference clock signal in response to the delay amount select signal.

13. The semiconductor apparatus according to claim 8, wherein the data detector comprises a trigger section comprising a plurality of triggers configured to receive a plurality of output data and output the received plurality of output data in synchronization with the delayed reference clock signal and outputs the output timing test data.

14. The semiconductor apparatus according to claim 13, wherein the data detector further comprises an input section configured to apply the plurality of output data to the trigger section in response to the output timing test signal.

15. The semiconductor apparatus according to claim 13, wherein the data detector further comprises a MUX section configured to output any one of the output data as the output timing test data in response to a select signal.

16. The semiconductor apparatus according to claim 15, wherein the MUX section receives the select signal sequentially, and sequentially outputs the plurality of output data.

17. The semiconductor apparatus according to claim 8, wherein the plurality of triggers comprises:

a buffer configured to buffer the output data;

a pass gate configured to transmit the buffered output data in response to the delayed reference clock signal; and a latch configured to latch an output of the pass gate in response to the delayed reference clock signal.

18. The semiconductor apparatus according to claim 8, wherein the test output unit outputs the transmit test data as the test output data to the probe pad when a deactivated timing test check signal is applied, and outputs the output timing test data as the test output data to the probe pad when the activated timing test check signal is applied.

* * * * *